United States Patent
Sogawa et al.

(10) Patent No.: US 11,939,661 B2
(45) Date of Patent: Mar. 26, 2024

(54) TUNGSTEN SPUTTERING TARGET AND METHOD FOR MANUFACTURING THE SAME

(71) Applicant: JX Nippon Mining & Metals Corporation, Tokyo (JP)

(72) Inventors: Shinji Sogawa, Ibaraki (JP); Takafumi Dasai, Ibaraki (JP); Seiji Nakasumi, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 457 days.

(21) Appl. No.: 16/758,589

(22) PCT Filed: Sep. 7, 2018

(86) PCT No.: PCT/JP2018/033273
§ 371 (c)(1),
(2) Date: Apr. 23, 2020

(87) PCT Pub. No.: WO2019/092969
PCT Pub. Date: May 16, 2019

(65) Prior Publication Data
US 2020/0370167 A1 Nov. 26, 2020

(30) Foreign Application Priority Data
Nov. 10, 2017 (JP) .................. 2017-217737

(51) Int. Cl.
*C23C 14/34* (2006.01)
*B22F 3/15* (2006.01)
(Continued)

(52) U.S. Cl.
CPC ............ *C23C 14/3414* (2013.01); *B22F 3/15* (2013.01); *B22F 3/18* (2013.01); *C22C 27/04* (2013.01)

(58) Field of Classification Search
CPC ... C23C 14/3414; C23C 14/165; C23C 14/14; B22F 3/15; B22F 3/18; B22F 2998/10; B22F 3/12; C22C 27/04; C22C 1/045
See application file for complete search history.

(56) References Cited

U.S. PATENT DOCUMENTS 6,238,494 B1 * 5/2001 Segal ................. C22F 1/04
148/426
2009/0214374 A1 * 8/2009 Ivanov ............... C23C 14/3414
419/23
(Continued)

FOREIGN PATENT DOCUMENTS

JP 3-150356 A 6/1991
JP 5-93267 A 4/1993
(Continued)

OTHER PUBLICATIONS

JPH0776771A Translation (Year: 1995).*
(Continued)

*Primary Examiner* — Nicholas A Smith
*Assistant Examiner* — Patrick S Ott
(74) *Attorney, Agent, or Firm* — NIELDS, LEMACK & FRAME, LLC

(57) ABSTRACT

According to one of various aspects of the present invention, a tungsten sputtering target has a purity of tungsten is 5 N (99.999% by weight) or more, and an impurity of carbon and an impurity of oxygen contained in tungsten are 50 ppm by weight or less, respectively, and an average grain size of tungsten crystal is more than 100 μm.

6 Claims, 1 Drawing Sheet

(51) Int. Cl.
*B22F 3/18* (2006.01)
*C22C 27/04* (2006.01)

(56) References Cited

U.S. PATENT DOCUMENTS

| | | | |
|---|---|---|---|
| 2015/0023837 A1* | 1/2015 | Ohashi | B22F 7/008 |
| | | | 420/430 |
| 2015/0303039 A1* | 10/2015 | Endo | C22F 1/16 |
| | | | 29/527.5 |
| 2015/0357170 A1 | 12/2015 | Ohashi et al. | |

FOREIGN PATENT DOCUMENTS

| | | | | |
|---|---|---|---|---|
| JP | 5-222525 | A | | 8/1993 |
| JP | H05222525 | A | * | 8/1993 |
| JP | 6-220625 | A | | 8/1994 |
| JP | 06220625 | A | * | 8/1994 |
| JP | 7-76771 | A | | 3/1995 |
| JP | H0776771 | A | * | 3/1995 |
| JP | 2001-295036 | A | | 10/2001 |
| JP | 2001-298036 | A | | 10/2001 |
| JP | 2003-55758 | A | | 2/2003 |
| JP | 2003-193111 | A | | 7/2003 |
| JP | 2003-226964 | A | | 8/2003 |
| WO | 2013/129434 | A1 | | 9/2013 |
| WO | 2014/148588 | A1 | | 9/2014 |
| WO | 2017/074728 | A1 | | 5/2017 |
| WO | WO-2017074728 | A1 | * | 5/2017 ............ B22F 3/162 |

OTHER PUBLICATIONS

JPH05222525A Translation (Year: 1993).*
JP-06220625-A Machine Translation (Year: 1994).*
JP-06220625-A Stic Translation of Tables (Year: 1994).*
International Search Report and Written Opinion dated Nov. 20, 2018 in corresponding PCT application No. PCT/JP2018/033273.
International Preliminary Report on Patentability dated May 12, 2020 in corresponding PCT application No. PCT/JP2018/033273.
Opposition to corresponding Austrian Patent No. AT 522305, Feb. 10, 2023.

* cited by examiner

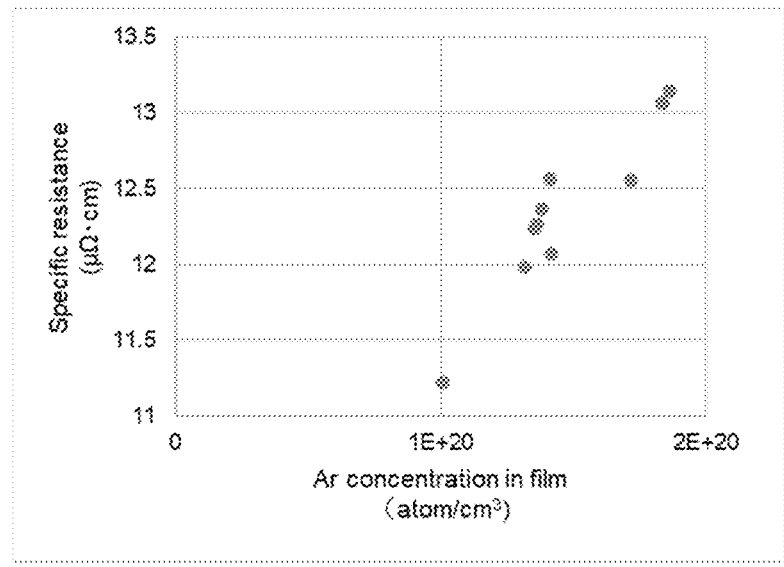

TUNGSTEN SPUTTERING TARGET AND METHOD FOR MANUFACTURING THE SAME

TECHNICAL FIELD

Field of the Invention

The present invention relates to a tungsten sputtering target and a method for manufacturing the same.

BACKGROUND ART

In recent years, with the increase in higher integration of VLSI, studies have been made to use materials having lower electrical resistivity as electrode materials and wiring materials. Under this circumstances, high-purity tungsten, which has a low resistivity and is thermally and chemically stable, is used as an electrode material and a wiring material.

The electrode material and wiring material for the VLSI are generally manufactured by a sputtering method and a CVD method. The sputtering method has a relatively simple equipment set up and operation, and is easier to form a film, and has a low cost. Therefore, it is more widely used than the CVD method.

High purity and high density are required for tungsten sputtering targets, but in recent years, relating to films formed by sputtering electrode materials and wiring materials for VLSI by using a tungsten sputtering target, materials having a lower electric resistivity are further required.

With this regard, Patent Literature 1 discloses a tungsten sintered body sputtering target, characterized in that the purity of tungsten is 5N (99.999% by weight) or more and the carbon as an impurity contained in the tungsten is 5 ppm by weight or less. By forming a film using such a tungsten sintered body sputtering target, there is an excellent effect that, in the tungsten film a stabilized reduce in the electrical resistivity can be achieved.

As described above, by increasing the purity of a tungsten sputtering target, Patent Literature 1 succeeds in reducing the specific resistance of a tungsten film formed by sputtering.

However, the lowering of the resistance of the tungsten film taking advantage of high purity is reaching its limit. Therefore, it is necessary to take other measures to further reduce the resistance.

CITATION LIST

Patent Literature

[Patent Literature 1] Japanese Patent No. 5944482

SUMMARY OF INVENTION

Problem to be Solved by the Invention

Therefore, an object of the present invention is to provide a tungsten sputtering target capable of forming a tungsten film having a low specific resistance when the tungsten film is formed using the tungsten sputtering target.

Means to Solve the Problem

In performing sputtering on a tungsten sputtering target, a method for forming a film wherein, a rare gas represented by Ar or Kr is made to collide at a high speed, and the repelled tungsten element is vapor deposited on a substrate surface such as a silicon (Si) wafer to have a predetermined thickness, can be considered. However, a rare gas such as Ar is fixed on the substrate surface together with the tungsten element during the film formation, and as a result, a tungsten film having incorporated Ar or the like may be formed. Such a tungsten film tends to have a higher specific resistance than a tungsten film in which Ar has not been taken in.

Therefore, in order to reduce the amount of rare gas atoms taken in, a method of using Kr gas which has a larger atomic radius is conceivable. However, since Kr gas is more expensive than Ar gas, it results in an increase in production cost. Therefore, improvement of the tungsten sputtering target itself is strongly desired.

Based on the above findings, the present invention provides a tungsten sputtering target in which a rare gas such as Ar or Kr is hardly taken into a tungsten film during film formation. This makes it possible to form a tungsten film having a smaller amount of incorporated Ar and the like, and to form a tungsten film having a lower specific resistance.

Further, the present inventors have made it possible to form a tungsten film having a low specific resistance by controlling the average grain size of the tungsten sputtering target to a range more than 100 μm.

Accordingly, the present invention is specified as follows.

(1) A tungsten sputtering target, wherein a purity of tungsten is 5 N (99.999% by weight) or more, and an impurity of carbon and an impurity of oxygen contained in tungsten are 50 ppm by weight or less, respectively, and an average grain size of tungsten crystal is more than 100 μm.

(2) The sputtering target according to claim 2), wherein a relative density is 99.3% or more.

(3) The sputtering target according to (1) or (2), wherein the carbon and the oxygen are 10 ppm by weight or less, respectively.

(4) A method for manufacturing a tungsten sputtering target in which tungsten powder is formed by a hot pressing (HP) method and then densified by a hot isostatic pressing (HIP) method, wherein a temperature in the hot isostatic pressing method is 1800° C. or more and a sintering time is 5.5 hours or more.

(5) A method for manufacturing a tungsten sputtering target in which tungsten powder is formed by a hot pressing (HP) method and then densified by a rolling method, wherein a temperature in the rolling method is 1200° C. or more and 1700° C. or less, and a total rolling reduction is 15% or more and 25% or less.

6. The method for manufacturing a tungsten sputtering target according to claim 5, wherein in the rolling method, a rolling reduction per rolling is 3 to 12%.

Effect of the Invention

According to the present invention, it is possible to provide a tungsten sputtering target capable of forming a tungsten film having a low specific resistance when the tungsten film is formed using the tungsten sputtering target.

BRIEF DESCRIPTION OF THE DRAWINGS

FIG. 1 is a diagram showing a correlation between the amount of Ar atoms incorporated in a tungsten film and the specific resistance of the tungsten film.

DESCRIPTION OF THE PREFERRED EMBODIMENTS

According to the present embodiment, a tungsten sputtering target, has a purity of tungsten of 5 N (99.999% by weight) or more, and an impurity of carbon and an impurity of oxygen contained in tungsten of 50 ppm by weight or less, respectively, and an average grain size of tungsten crystal more than 100 µm.

(Purity)

In order to form a tungsten film having a low specific resistance, it is necessary to suppress impurities contained in the tungsten film. Therefore, it is indispensable to increase the purity of the tungsten sputtering target. Specifically, it is necessary to have a purity of 99.999% by weight (5 N) or more.

(Impurities)

Further, since impurities such as carbon and oxygen contained in the target are incorporated into the tungsten film at the time of film formation, the specific resistance of the tungsten film after the film formation by sputtering tends to increase as the amount of carbon increases. Therefore, it is necessary that the impurity of carbon and the impurity of oxygen contained in tungsten be 50 ppm by weight or less, respectively. From the same viewpoint, the impurity of carbon and the impurity of oxygen contained in tungsten are preferably 30 ppm by weight or less, and more preferably 20 ppm by weight or less, respectively. If the carbon content and the oxygen content are 10 ppm by weight or less, respectively, the influence on the specific resistance of the tungsten film almost disappear.

In order to reduce carbon, when tungsten powder is filled in a graphite die and hot-pressed, it is preferable that the tungsten powder be isolated so that it does not come into direct contact with the graphite die.

(Average Grain Size of Tungsten Crystal)

In the tungsten sputtering target according to the present embodiment, the average grain size of the tungsten crystal is more than 100 µm. Conventionally, it is known that the average grain size of tungsten crystal is related to the density of the tungsten sputtering target, but the relationship between the average grain size of the tungsten crystal and the amount of Ar atoms incorporated into the tungsten film during film formation has not been investigated. In the present embodiment, since the average grain size of the tungsten crystal is more than 100 µm, it becomes difficult for Ar atoms to be incorporated into the tungsten film during film formation, and as a result, a tungsten film with a small amount of incorporated Ar can be obtained. In other words, even if the tungsten sputtering targets have the same purity, density, and the like, a tungsten sputtering target an average grain size of tungsten crystal of more than 100 µm is capable of obtaining a tungsten film having a lower specific resistance than that of an average grain size of tungsten crystal of 100 µm or less. Therefore, the average grain size of the tungsten crystal in the present embodiment is preferably 120 µm or more, more preferably 150 µm or more, and still more preferably 200 µm or more.

The average grain size of tungsten crystal can be determined by a value according to the average line segment length per crystal grain of an evaluation test line crossing the inside of the crystal grain evaluated by the cutting method according to JIS G 0551: 2013. Specifically, the structure is observed with an optical microscope. In the observed and preserved structure photograph, a straight line is drawn on the photograph until the number of particles existing on the straight line N=200, then using the number of particles (N≥200) and the total length (L) of the straight line, the average grain size of the observed site is calculated by L/N.

(Relative Density)

The relative density of the tungsten sputtering target is preferably 99.3% or more. If the relative density of the target is 99.5% or more, the gas component contained in the target is fewer, so that when a film is formed, the specific resistance of the film can be further suppressed. Further, dust generation due to abnormal discharge is also suppressed. From the above viewpoint, the relative density of the target is more preferably 99.7% or more, and still more preferably 99.9% or more.

(Manufacturing Method)

The manufacturing method of the tungsten sputtering target according to the present embodiment is not particularly limited as long as it has each of the above-described characteristics, and as one means to obtain a tungsten sputtering target having such characteristics, a powder metallurgy method in which a hot pressing method (HP) and a hot isostatic pressing method (HIP) are combined can be used. Further, by controlling the appropriate conditions of the HIP after the HP as follows, the characteristics of the tungsten sputtering target according to the present invention described above can be obtained. Further, in addition to the powder metallurgy method in which the HP method and the HIP method are combined, the above-described characteristics of the tungsten sputtering target according to the present invention can be obtained as well by performing a rolling treatment under appropriate conditions after the HP method.

First, in the HP process, a predetermined mold is filled with tungsten powder as a raw material, and heat is applied thereto while a load being applied. The tungsten powder used here preferably has a grain size of 5 µm or less. In the HP step, while increasing the temperature at an appropriate temperature increasing rate, for each temperature range a suitable load is applied till the temperature increases to the HP temperature, and the temperature is maintained at the HP temperature for a predetermined time. At this time, it is preferable that the temperature increasing rate is about 2 to 10° C./min. In this HP step, it is preferable to appropriately adjust and change the load applied in the temperature range of 600 to 1200° C. and the temperature range of 1200° C. or more, respectively. In the HP process, degassing occurs at the initial stage of temperature increasing. If a high load is applied at this stage, sintering proceeds without sufficient degassing, and the sintered body does not develop a high density. In addition, a large amount of residual gas components such as oxygen are contained inside. Therefore, in the HP step, the sintered body is densified by applying a low load in a low temperature range and applying a higher load in a high temperature range, and thus a sintered body having a small amount of residual oxygen can be obtained. Specifically, the load pressure in the temperature range of 600 to 1200° C. is preferably about 80 to 150 kg/cm$^2$, and the load pressure in the temperature range of 1200° C. or more is preferably about 200 to 350 kg/cm$^2$. In addition, during the temperature increasing process, it is effective to introduce a process(es) of maintaining the work at a certain temperature for a certain period of time several times in order to obtain a sintered body having a high density and a random orientation. The HP temperature at this time is preferably about 1600 to 1900° C. If the HP temperature is too low, the density does not sufficiently increase, and if it is too high, the formation of a carbide layer on the tungsten surface proceeds, which is not preferable. If the temperature increasing rate is too fast, degassing in the HP will not proceed sufficiently, which is not preferable. Obviously, a too low temperature increasing rate is not preferable either because productivity is lowered. The holding time in this step is about 30 to 240 minutes, and can be appropriately adjusted in consideration of conditions such as temperature. The holding time at the HP temperature can be similarly set and adjusted.

As to the formed body after the HP process, in order to increase the average grain size of tungsten crystal and increase the density of the formed body, it is effective to subject the HP formed body to a HIP process. In the present embodiment, it is important that the temperature during the HIP processing is 1800° C. or more and the processing time is 5.5 hours or more. By setting the conditions of the HIP process to the above conditions, a tungsten sputtering target having an average grain size of tungsten crystals more than 100 μm can be obtained. The pressure of the HIP process can be adjusted to 1600 to 1900 kg/cm² as a guide. The upper limit of the temperature during the HIP process is not particularly limited, but is preferably 2200° C. or less from the viewpoint of cost. The upper limit of the time of the HIP process is not particularly limited, but is preferably 8 hours or less from the viewpoint of cost.

In addition, it is to be noted that the formed body after the HP process may be subjected to a plastic working by rolling instead of the HIP. By adjusting the conditions of a hot rolling, the average grain size of tungsten crystal of the tungsten sputtering target according to the present embodiment can be controlled. Specifically, the rolling temperature needs to be 1200° C. or more and 1700° C. or less, and it is important that the total rolling reduction is about 15 to 25%. Here, the total rolling reduction is a value obtained by multiplying the rolling reduction per rolling by the number of passes of the rolling process. The rolling reduction per rolling is represented by the following equation. The rolling reduction in one rolling is preferably about 3 to 12%. In addition, the number of passes is desirably 4 to 6 times.

$$\text{Rolling reduction per rolling} = (h_{n-1} - h_n)/h_0$$

In the equation, $h_0$ is the initial thickness of the formed body, $h_{n-1}$ is the thickness of the formed body immediately before rolling at the current pass, and $h_0$ is the thickness of the formed body after rolling by this pass.

EXAMPLES

Hereinafter, some embodiments of the present invention will be specifically described based on Examples and Comparative Examples. The description of the following Examples and Comparative Examples are merely specific examples for facilitating the understanding of the technical contents of the present invention, and the technical scope of the present invention is not limited by these specific examples.

Examples 1 to 3

A carbon die was filled with tungsten powder having a purity of 5N (99.999% by weight) and an average grain size of 1 μm, and was subjected to HP at a maximum temperature of 1600° C. in a vacuum chamber. The HP load applied at this process was 240 kgf/cm². The HP formed body thus obtained was further subjected to a HIP process under the conditions shown in Table 1. The shape of the sintered body subjected to the HIP process was processed to obtain a sputtering target having a diameter of 400 mm and a thickness of 6 mm.

Examples 4

A carbon die was filled with tungsten powder having a purity of 5N (99.999% by weight) and an average grain size of 1 μm, and was subjected to HP at a maximum temperature of 1600° C. in a vacuum chamber. The HP load applied at this process was 240 kgf/cm². The formed body after HP obtained as described above was further subjected to rolling process at 1400° C. with the number of times of rolling being 6 times, the rolling reduction per rolling being 4.2%, and the total rolling reduction being 25%.

Examples 5

A carbon die was filled with tungsten powder having a purity of 5N (99.999% by weight) and an average grain size of 1 μm, and was subjected to HP at a maximum temperature of 1600° C. in a vacuum chamber. The HP load applied at this process was 240 kgf/cm². The formed body after HP obtained as described above was further subjected to rolling process at 1400° C. with the number of times of rolling being 5 times, the rolling reduction per rolling being 5.0%, and the total rolling reduction being 25%.

Examples 6

A carbon die was filled with tungsten powder having a purity of 5N (99.999% by weight) and an average grain size of 1 μm, and was subjected to HP at a maximum temperature of 1600° C. in a vacuum chamber. The HP load applied at this process was 240 kgf/cm². The formed body after HP obtained as described above was further subjected to rolling process at 1700° C. with the number of times of rolling being 4 times, the rolling reduction per rolling being 3.8%, and the total rolling reduction being 15%.

Comparative Examples 1 to 3

A carbon die was filled with tungsten powder having a purity of 5N (99.999% by weight) and an average grain size of 1 μm, and was subjected to HP at a maximum temperature shown in table 1 in a vacuum chamber. The HP load applied at this process was 240 kgf/cm². The HP formed body thus obtained was further subjected to a HIP process under the conditions shown in Table 1. The shape of the sintered body subjected to the HIP process was processed to obtain a sputtering target having a diameter of 400 mm and a thickness of 6 mm.

Comparative Examples 4

A carbon die was filled with tungsten powder having a purity of 5N (99.999% by weight) and an average grain size of 1 μm, and was subjected to HP at a maximum temperature of 1200° C. in a vacuum chamber. The HP load applied at this process was 240 kgf/cm². The formed body after HP obtained as described above was further subjected to rolling process at 1400° C. with the number of times of rolling being 8 times, the rolling reduction per rolling being 11.3%, and the total rolling reduction being 90%.

The obtained tungsten sputtering target was measured as follows.
(Impurity Concentration)

The carbon concentration was measured by pulverizing each tungsten sputtering target and then using an inert gas melting method for the sample with a carbon analyzer [CSLS600, manufactured by LECO].

The oxygen concentration was measured by an inert gas melting method for the above-described sample using an oxygen/nitrogen simultaneous analyzer (TC-600, manufactured by LECO Corporation).

(Average Grain Size of Tungsten Crystal)

The structure was observed with an optical microscope. In the observed and preserved structure photograph, a straight line was drawn on the photograph until the number of particles existing on the straight line N=200, then using the number of particles (N≥200) and the total length (L) of the straight line, the average grain size of the observed site was calculated by L/N.

(Relative Density)

Relative density as referred to herein refers to the ratio of the measured density to the theoretical density. The measured density refers to a value measured by the Archimedes method using pure water as a solvent. As the theoretical density, the theoretical density when the tungsten content is 100% is used.

Further, a tungsten film was formed on a silicon substrate by sputtering using Ar gas using each of the tungsten sintered body targets prepared in Examples 1 to 6 and Comparative Examples 1 to 4, and the carbon concentration, oxygen concentration, Ar concentration and specific resistance of the formed films were measured as follows.

(Carbon Concentration, Oxygen Concentration, Ar Concentration)

Measurement was conducted by secondary ion mass spectrometry (SIMS). As a measuring device, PHI ADEPT1010 manufactured by ULVAC-PHI Incorporated was used. In addition, "Undetectable" in Table 1 means that the value is less than the detection limit value of the SIMS method.

(Method for Measuring Specific Resistance)

The sheet resistance at seven points on the wafer was measured using OMNIMAP RS75 manufactured by KLA-Tencor Corporation, each multiplied by the film thickness measured by XRR (X-ray reflectivity measurement), and the average value was defined as the specific resistance of the film.

TABLE 1

| | HP Conditions | HIP Conditions Temperature (° C.) | Time (h) | Temperature (° C.) | Rolling reduction per rolling (%) | Number of times of rolling | Total rolling reduction (%) | Purity | Carbon concentration (ppm by weight) |
|---|---|---|---|---|---|---|---|---|---|
| Example 1 | 1600° C. | 1850 | 6 | — | — | — | — | 5N | 2.8 |
| Example 2 | 1600° C. | 1800 | 5.5 | — | — | — | — | 5N | 4.1 |
| Example 3 | 1600° C. | 1900 | 5.5 | — | — | — | — | 5N | 3.6 |
| Example 4 | 1600° C. | — | — | 1200 | 4.2 | 6 | 25 | 5N | 5.5 |
| Example 5 | 1600° C. | — | — | 1400 | 5.0 | 5 | 25 | 5N | 11.1 |
| Example 6 | 1600° C. | — | — | 1700 | 3.8 | 4 | 15 | 5N | 3.9 |
| Comparative Example 1 | 1800° C. | 1850 | 2 | — | — | — | — | 5N | 12.8 |
| Comparative Example 2 | 1600° C. | 1750 | 2 | — | — | — | — | 5N | 6.4 |
| Comparative Example 3 | 1600° C. | 1600 | 6 | — | — | — | — | 5N | 7.4 |
| Comparative Example 4 | 1200° C. | — | — | 1400 | 11.3 | 8 | 90 | 5N | 8.6 |

| | Oxygen concentration (ppm by weight) | Average grain size of tungsten crystal (μm) | Relative density (%) | Carbon concentration in film (atoms/cm$^3$) | Oxygen concentration in film (atoms/cm$^3$) | Ar concentration in film (atoms/cm$^3$) | Specific resistance (μΩ·cm) |
|---|---|---|---|---|---|---|---|
| Example 1 | 0.6 | 113 | 99.53 | Undetectable | Undetectable | 1.35E+20 | 12.24 |
| Example 2 | 1.2 | 101 | 99.51 | Undetectable | Undetectable | 1.38E+20 | 12.36 |
| Example 3 | 1.6 | 124 | 99.65 | Undetectable | Undetectable | 1.36E+20 | 12.26 |
| Example 4 | 9.2 | 388 | 99.55 | 2.36E+19 | 1.80E+19 | 1.32E+20 | 11.98 |
| Example 5 | 8.4 | 406 | 99.64 | 2.39E+19 | 2.00E+19 | 1.01E+20 | 11.22 |
| Example 6 | 2.7 | 347 | 99.38 | 2.40E+19 | 1.65E+19 | 1.42E+20 | 12.07 |
| Comparative Example 1 | 13.1 | 18 | 98.81 | 2.84E+19 | 1.96E+19 | 1.72E+20 | 12.55 |
| Comparative Example 2 | 17.0 | 45 | 99.17 | 2.39E+19 | 1.70E+19 | 1.41E+20 | 12.56 |
| Comparative Example 3 | 1.6 | 16 | 98.03 | Undetectable | Undetectable | 1.83E+20 | 13.06 |
| Comparative Example 4 | 7.9 | 9 | 99.43 | 2.48E+19 | 1.96E+19 | 1.86E+20 | 13.14 |

In Examples 1 to 6, since the average grain size of tungsten crystal was more than 100 μm, the amount of Ar atoms incorporated into the film during film formation was small, and the specific resistance of the film was low.

On the other hand, since the average grain size of tungsten crystals of Comparative Examples 1 to 4 was 100 μm or less, a large amount of Ar atoms was incorporated into the film at the time of film formation, and the specific resistance of the film was high.

What is claimed is:

1. A tungsten sputtering target, wherein a purity of tungsten is 5 N (99.999% by weight) or more, and an impurity of carbon and an impurity of oxygen contained in tungsten are 50 ppm by weight or less, respectively, and an average grain size of tungsten crystal is more than 347 μm.

2. The sputtering target according to claim 1, wherein the carbon and the oxygen are 10 ppm by weight or less, respectively.

3. The sputtering target according to claim 1, wherein a relative density of the sputtering target is 99.3% or more.

4. The sputtering target according to claim 1, wherein the sputtering target consists of tungsten and inevitable impurities.

5. A method for manufacturing a tungsten sputtering target in which tungsten powder is formed by a hot pressing (HP) method and then densified by a rolling method, wherein a temperature in the rolling method is 1200° C. or more and 1700° C. or less, and a total rolling reduction is 15% or more and 25% or less, such that an average grain size of tungsten crystal of the tungsten sputtering target is 120 μm or more.

6. The method for manufacturing a tungsten sputtering target according to claim 5, wherein in the rolling method, a rolling reduction per rolling is 3 to 12%.

* * * * *